United States Patent
Toriyama et al.

(10) Patent No.: US 6,452,378 B1
(45) Date of Patent: *Sep. 17, 2002

(54) PROBE FOR ELECTRO-OPTIC SAMPLING OSCILLOSCOPE

(75) Inventors: Noriyuki Toriyama, Tokyo (JP); Toshiyuki Yagi, Tokyo (JP); Tadao Nagatsuma, Sagamihara (JP)

(73) Assignees: Ando Electric Co., Ltd., Tokyo (JP); Nippon Telegraph and Telephone Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/574,155

(22) Filed: May 18, 2000

(30) Foreign Application Priority Data

Jun. 3, 1999 (JP) .......................................... 11-157150

(51) Int. Cl.[7] ...................... G01R 13/38; G01R 31/305; G01R 31/302; G01R 31/308
(52) U.S. Cl. ......................... 324/97; 324/751; 324/752; 324/753
(58) Field of Search ............................ 324/97, 96, 750, 324/751, 752, 753; 356/432, 445

(56) References Cited

U.S. PATENT DOCUMENTS

| | | | |
|---|---|---|---|
| 4,273,421 A | * 6/1981 | Gurtler | 350/353 |
| 5,150,043 A | * 9/1992 | Flesner | 324/752 |
| 5,465,043 A | 11/1995 | Sakai | |
| 5,479,106 A | 12/1995 | Takahashi et al. | |
| 5,808,473 A | 9/1998 | Shinagawa et al. | |
| 5,966,019 A | * 10/1999 | Borden | 324/752 |

FOREIGN PATENT DOCUMENTS

GB 2344170 A 5/2000

OTHER PUBLICATIONS

Office Action from German Patent Office, German Patent Application No. 10026280.5, dated Sep. 14, 2001, together with English translation.

* cited by examiner

*Primary Examiner*—N. Le
*Assistant Examiner*—Anjan K. Deb
(74) *Attorney, Agent, or Firm*—Darby & Darby

(57) ABSTRACT

An electro-optic sampling probe is provided, capable of irradiating a plurality of excitation light beams on a plurality of light receiving portions mounted on an IC wafer which is an object for measurement. The electro-optic sampling probe comprises a plurality of excitation optical system modules which commonly uses an objective lens for condensing the excitation light beams on the IC wafer and a detachable portion for attaching and detaching the excitation optical system module, a second probe body for covering the optical path of a light beam emitted from the excitation optical system module is provided at the rear side of the IC wafer, and at least one of the plurality of excitation optical system modules have an optical axis which differs from those of other modules; thereby at least two excitation light beams can be irradiated on the light receiving portions on the IC wafer surface.

7 Claims, 5 Drawing Sheets

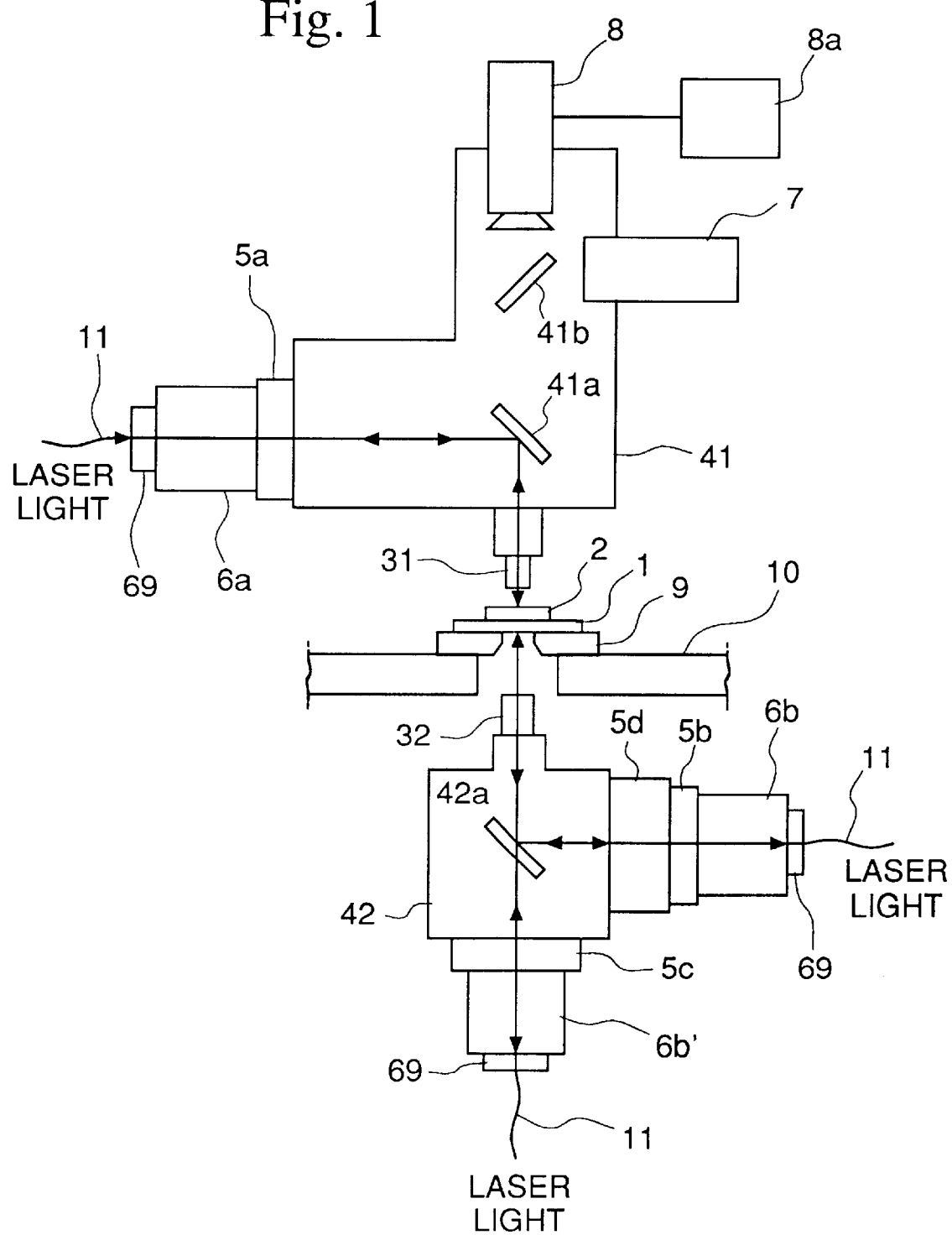

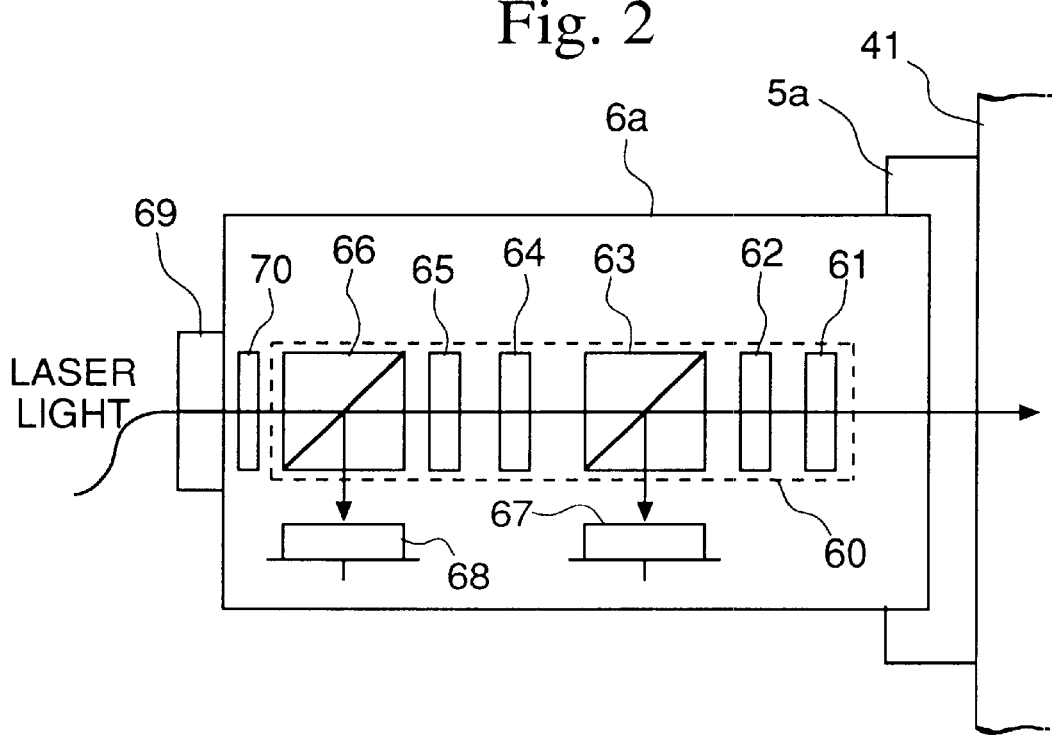
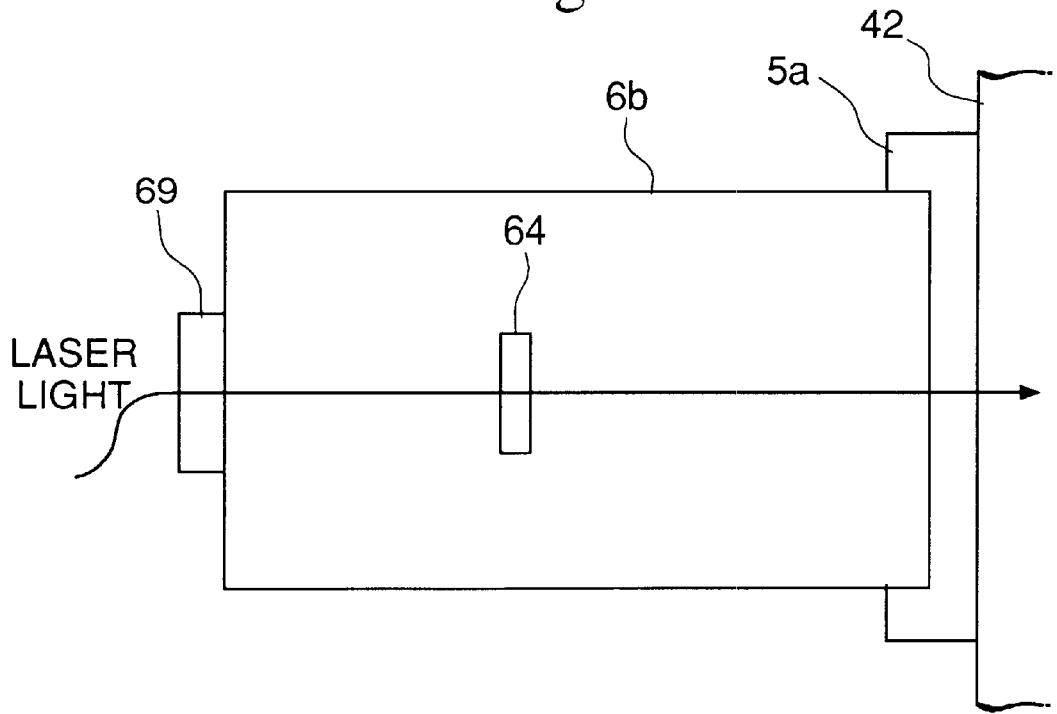

PROBE FOR ELECTRO-OPTIC SAMPLING OSCILLOSCOPE

BACKGROUND OF THE INVENTION

1. Field of the Invention

The present invention relates to an electro-optic sampling probe, which is used for observing the waveforms of a test signal based on a change in the polarization state of a light pulse caused when the light pulse generated by a timing signal is input into an electro-optic crystal which is coupled with an electric field generated by the test measuring signal, and particularly relates to the electro-optic sampling probe provided with an improved optical system of the probe.

2. Background Art

An electro-optic probe is capable of observing waveforms of a test signal based on a change in the polarization state of a laser light caused when the light pulse generated by a timing signal is input into an electro-optic crystal which is coupled with an electric field generated by the test measuring signal. When the laser light is emitted in a pulsed mode, and when the test signal is used after sampling, the measurement can be executed that has a very high time resolution. An electro-optic sampling probe is developed by the use of the electro-optic probe utilizing the above phenomenon.

The electro-optic sampling probe (hereinafter, called EOS probe) has following advantages over the conventional probe using an electric probe, and thus such a probe is attracting attention.

(1) Measurement is easy, because a ground line is not necessary during measurement.

(2) Since the top end of the present electro-optic probe is insulated from the measuring circuit, a high input impedance is provided, which results in eliminating factors that disturb the conditions of the test point.

(3) The use of the light pulse allows carrying out wideband measurement reaching to the GHz order.

(4) Measurement can be executed for wiring that is too fine to be measured by direct contact with a metal pin by placing an electro-optic crystal in contact with an IC (Integrated Circuit) and by collimating the laser beam on the IC wafer.

The structure of the conventional electro-optic probe will be described with reference to FIG. 6. In FIG. 6, the numeral 1 denotes an IC wafer, which is connected with the outside through an electric source line and a signal line. The numeral 2 denotes an electro-optic element formed by an electro-optic crystal. The numeral 31 is an objective lens used for condensing a light incident to the electro-optic element. The numeral 41 is a probe body provided with a dichromic mirror 41a and a half-mirror 41b. The numeral 6a denotes an EOS optical module (hereinafter called an EOS optical system), and a fiber collimator 69 is mounted on one end of the EOS optical system.

The numeral 7 denotes a halogen lamp for illuminating the IC wafer for measurement. The numeral 8 denotes an infrared camera (hereinafter, called IR camera) used for confirming the positioning of the light condensed on the wiring of the IC wafer 1. The numeral 9 denotes an absorption stage for absorbing and fixing the IC wafer 1, and the absorption stage is capable of fine movement in the three directions of the x-axis, the y-axis, and the z-axis, which crosses each other at right angles. The numeral 10 denotes a standard table (partly omitted) to which the absorption stage 9 is fixed. The numeral 11 denotes an optical fiber for propagating the laser light that enters from the outside.

A light path of the laser light that enters from the outside is described with reference to FIG. 6. The light path of the laser light in the probe body 41 is shown by a reference symbol A.

The laser light incident to the EOS optical system 6a through the optical fiber is collimated into a parallel light beam by a fiber collimator 69, propagates through the EOS optical system 6a, and enters into probe body 41. Furthermore, the laser light propagates into the probe body 41, turned by 90 degrees by a dichromic mirror 41a, and condensed by an objective lens to the electro-optic element 2 at its surface that faces the IC wafer 1.

Here, a wavelength of the laser light entering into the EOS optical system though the optical fiber 11 is 1550 nm. In contrast, the optical properties of the above-mentioned dichromic color 41a allow transmission of 5% and reflectance of 95% of the light with a wavelength of 1550 nm. Therefore, 95% of the light emitted from the laser source is reflected and turned by 90 degrees.

A dielectric mirror is deposited on the surface of the electro-optic element that faces the IC wafer 1, and the laser light reflected at that surface is again collimated into parallel beams by the objective lens 31, returns to the EOS system. 6a passing along the same optical path, and entered into a photodiode (not shown) in the EOS optical system 6a.

Next, a description is given on the light path of a light emitted by the halogen lamp 7 and a positioning operation of the IC wafer 1, when the positioning operation of the IC wafer 1 is carried out by use of the halogen lamp 7 and the IR camera 8. In FIG. 6, the symbol B denotes the light path of the halogen lamp 7.

The halogen lamp 7 used in this positioning operation emits light having wavelengths ranging from 400 nm to 1650 nm.

The light emitted from the halogen lamp 7 is turned by 90 degrees by the half mirror 41b, passes through the dichromic mirror 41a, and illuminates the IC wafer 1. The half mirror 41b used in this positioning operation yields reflected light with the same intensity as that of the transmitted light.

The IR camera 8 picks up an image of a part of the IC wafer 1 in the field of the objective lens illuminated by the halogen lamp 7, and the IR image is displayed on a monitor 8a. An operator executes fine movement of the absorption stage such that a measuring object, that is, the wiring on the IC wafer enters to a field of view.

Furthermore, the operator adjusts the position of the absorption stage 9 or the probe body 41 such that the laser light is condensed precisely on the surface of the electro-optic element 2 placed on the wiring of the IC wafer by confirming the laser light from the image of the IR camera 8 enters into the EOS optical system through the optical fiber 11, is reflected by the surface of the electro-optic element 2 placed on the wiring of the IC wafer 1, and passes through the dichromic mirrors 41a.

In this operation, the laser light passing through the dichromic mirror 41a can be recognized by the IR camera 8, since the dichromic mirror can transmit about 5% of light in the wavelength range of the laser light.

Here, a measuring operation of test signals by use of the EOS probe shown in FIG. 6 is described.

When a voltage is applied on the wiring of the IC wafer, the electric field is applied to the electro-optic element 2, causing a change in its refractive index due to the Pockels effect. Thereby, when the laser light enters into the electro-optic element, reflected at the surface of the electro-optic element placed facing the IC wafer, returns the same light path, and exits from the electro-optic element, the polarizing state of the laser light changes. After being subjected to the change of the polarizing state, the laser light enters again on the EOS optical system 6a.

Since the polarized state of the electro-optic element in the EOS optical system has been changed, the intensity of the light incident to the EOS optical system is changed in accordance with the change of polarized state, the change of the light intensity is converted into an electric signal after being received by a photodiode, and the electric signals applied to the IC wafer 1 can be measured by processing the signals from the photodiode.

There are some ICs such as light switches which are operated by irradiation of excitation light, that is, light for excitation on the front surface or the rear surface of the IC wafer. However, the problem arises in the conventional electro-optic sampling probe that the measurement of the electric signals can not be simultaneously carried out while the excitation light is irradiated on the front or the rear surfaces.

In order to solve the above problem, Japanese Unexamined Patent Application, First Publication No. Hei 10-340824, discloses an electro-optic sampling probe, capable of irradiating the excitation light from both surfaces of the IC wafer without displacing the IC wafer and capable of measuring electric signals while irradiating sampling light from surfaces of the IC wafer.

However, the problem still arises in the above electro-optic sampling probe that the excitation light can not simultaneously enters on a plurality of light receiving portions provided on the IC wafer 1. If the spot size of the excitation light is enlarged so as to simultaneously irradiate the plurality of light receiving portions, the excitation light irradiates the surface area outside of the light receiving portion, which leads to an inaccurate measurement. In addition, the problem still remains that the enlarged spot irradiation does not allow sequential time measurement.

SUMMARY OF THE INVENTION

It is therefore an object of the present invention to provide an electro-optic sampling probe capable of entering the excitation light simultaneously on a plurality of light receivers provided on the IC wafer.

BRIEF DESCRIPTION OF THE DRAWINGS

FIG. 1 is a diagram showing a structure of one embodiment of the present invention.

FIG. 2 is a diagram showing a structure of an EOS optical system 6a shown in FIG. 1.

FIG. 3 is a diagram showing a structure of an excitation optical system 6b shown in FIG. 1.

DETAILED DESCRIPTION OF THE INVENTION

An electro-optic sampling probe according to one embodiment of the present invention will be described with reference to attached drawings.

Figure 6:
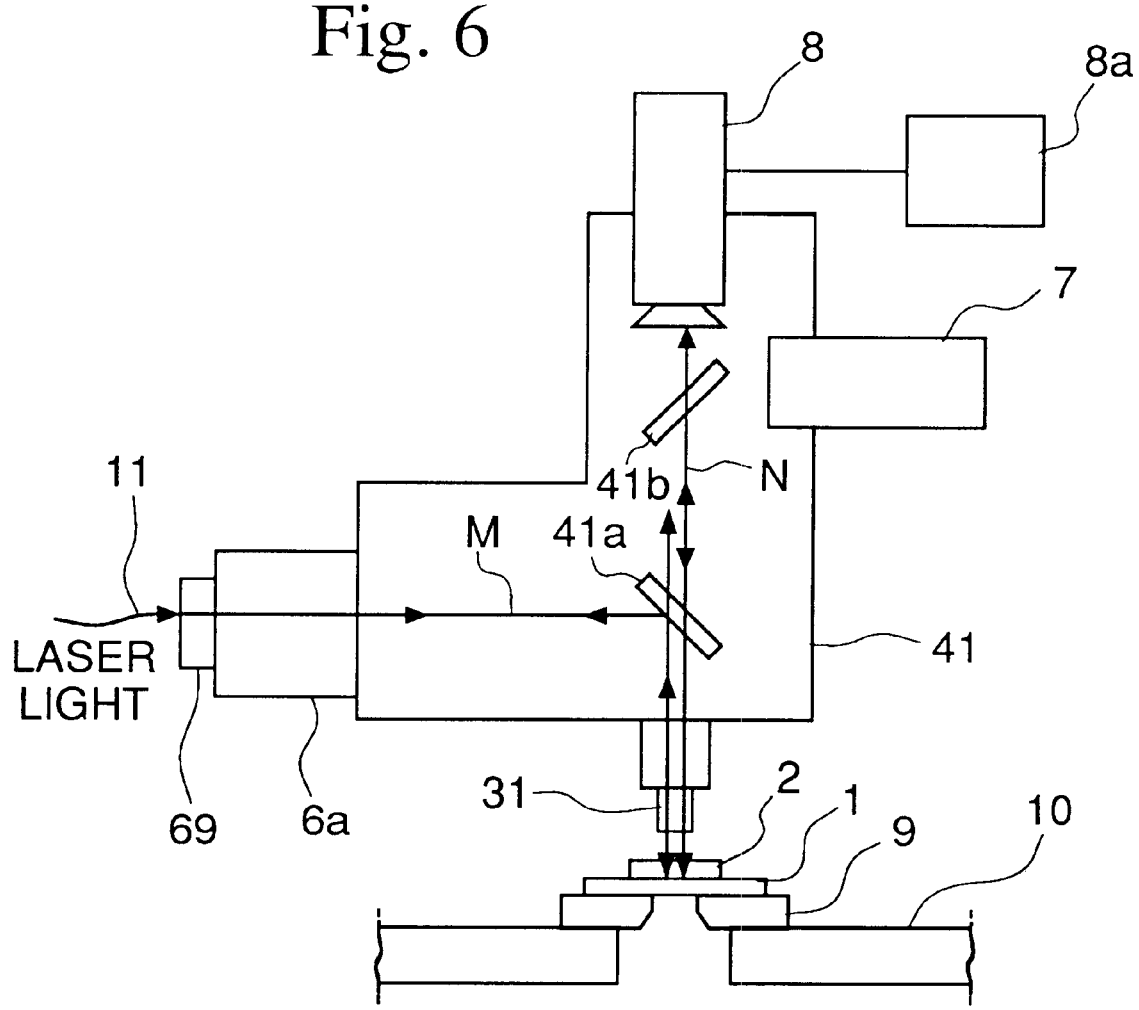
FIG. 6 is a diagram showing a structure of a conventional electro-optic sampling probe.

FIG. 1 is a diagram showing a structure of one embodiment of the present invention. In FIG. 1, the same components as those of the conventional probe shown in FIG. 6 are denoted by the same reference numerals and explanations for these components are omitted. The differences between the electro-optic probe shown in FIG. 1 and the conventional probe are the provision of two excitation optical systems for outputting the excitation light 6b and 6b' (hereinafter, called excitation optical system) under the standard table 10, provision of a probe body 42, and fixation of these two excitation optical systems 6b and 6b' to the probe body 42 by means of detachable portions 5b and 5c'.

Here, the above two excitation optical systems 6b and 6b' have the same structure.

Furthermore, the excitation optical systems 6b and 6b' are fixed through respective light axis adjusting portions 5d provided between the probe body 42 and the light axis adjusting portions 5b.

FIG. 2 is a diagram showing a structure of an EOS optical system 6a shown in FIG. 1 In FIG. 2, the numerals 61, 64, and 70 denote half-wave plates, and 62 denotes a quarter-wave plate. The numerals 63 and 66 denote polarized beam splitters, and 65 denotes a Faraday element. An optical system constituted by half-wave plates 61, 64, and 70, the quarter-wave plate 62, polarized beam splitters 63 and 66, and the Faraday element 65 is an optical isolator. The numerals 67 and 68 denote photodiodes.

FIG. 3 is a diagram showing a structure of an excitation optical system 6b shown in FIG. 1. This excitation optical system 6b has the same structure as that of the EOS optical system 6a, and the excitation optical system 6b is constituted only by the one optical component of the half-wave plate 64.

Figure 4:
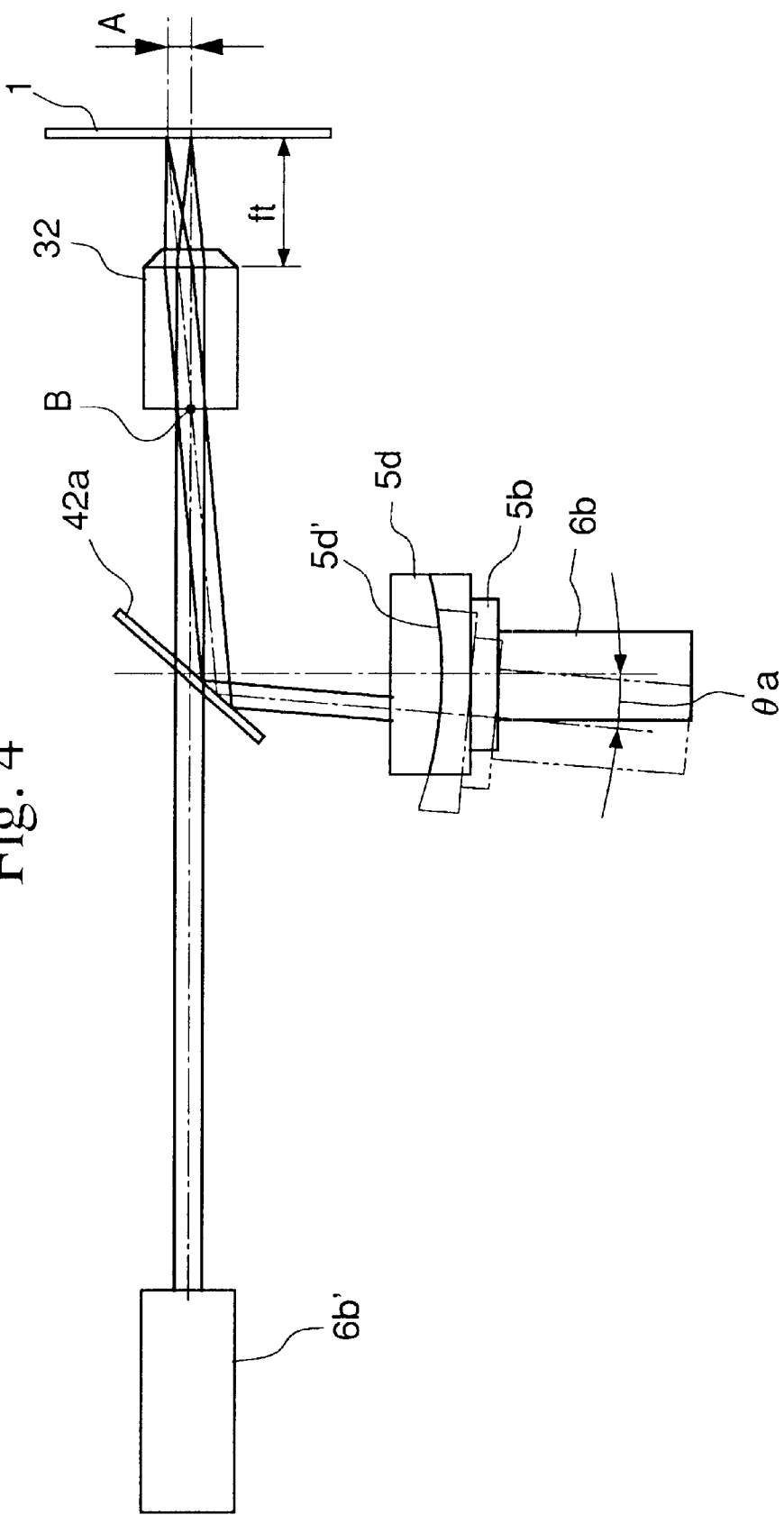
FIG. 4 is a diagram for explaining a structure of a light axis adjusting portion 5d shown in FIG. 1 and a light path of the excitation light.
Figure 5:
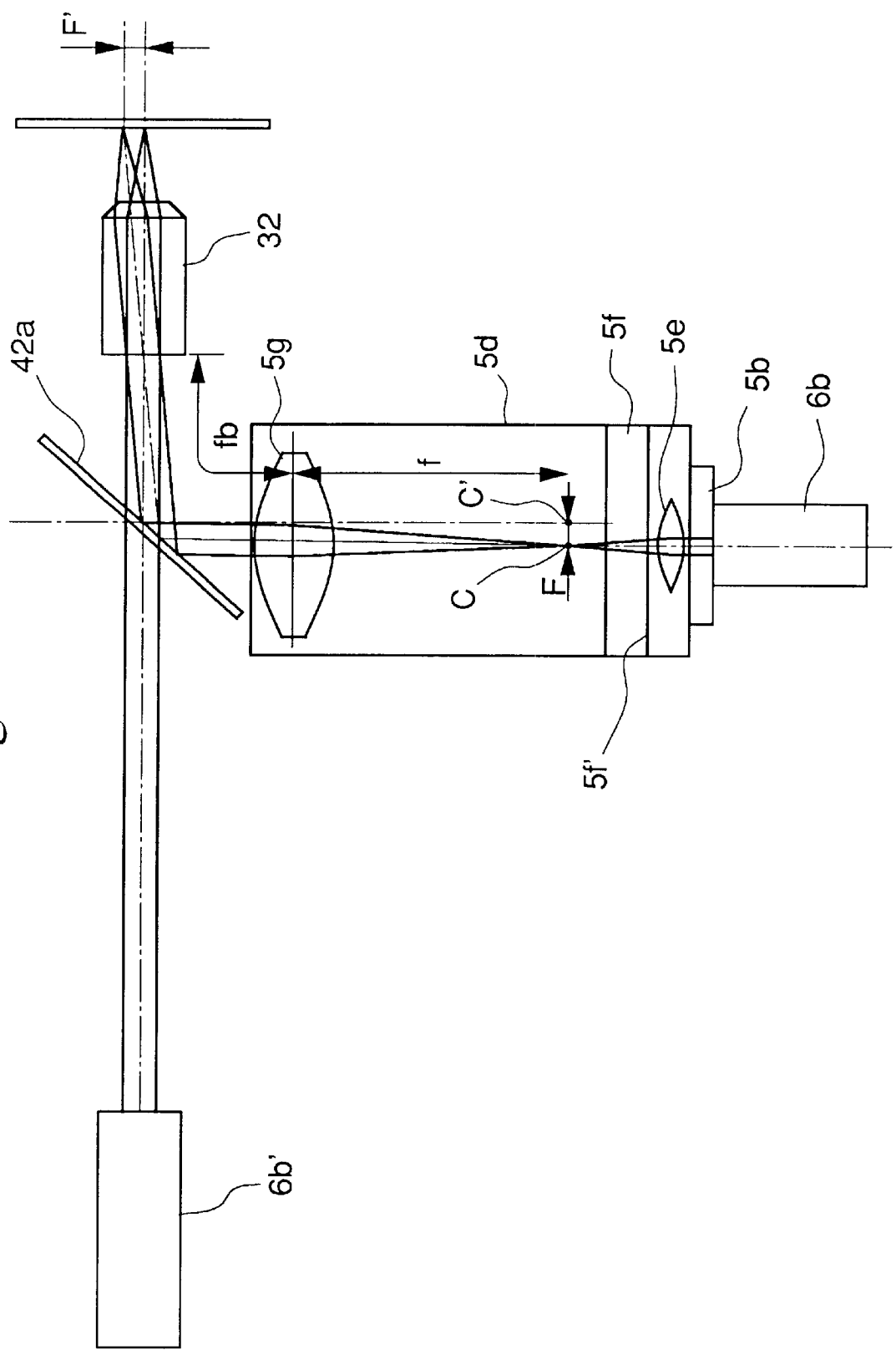
FIG. 5 is a diagram for explaining a structure of a light axis adjusting portion 5d shown in FIG. 1 and a light path of the excitation light.

FIGS. 4 and 5 are diagrams for explaining a structure of a light axis adjusting portion 5d shown in FIG. 1 and a light path of the excitation light.

Here, an operation is described to measure the electric signals on the front surface of the IC wafer 1, when the excitation light is irradiated on the rear surface.

First, an operation is described to irradiate the rear surface with the excitation light.

Laser light is supplied from the outside to the excitation optical system 6b through an optical fiber 11. This laser light is collimated into a parallel beam by the fiber collimator 69.

The collimated laser beam is then turned by 90 degrees by a half mirror 42a and is condensed to the rear surface of the IC wafer 1 by an objective lens 32. Thereby, the IC wafer, that is, the object for measurement can be operated by irradiating the excitation light on the rear surface.

It is to be noted that, when two polarization optical systems are provided, efficient condensation of the polarization light by two optical systems can be realized without loss of light by inserting a polarization controller for each excitation light system and by replacing each half mirror 42a with a polarized beam splitter (PBS), respectively.

Next, an operation is described for making excitation light incident on respective light receiving portions when two light receiving portions are provided on the IC wafer 1.

First, an explanation is given of an example of the light axis adjusting portion which is constituted by a goniometer. The excitation optical system 6b' shown in FIG. 4 is fixed to the probe body 42, and the parallel light emitted from this excitation optical system 6b' goes straight into the probe body 42, propagates through the half mirror 42a, and is condensed on the light receiving portion of the IC wafer 1 by the objective lens 32. Since the objective lens 32 is disposed separated from the IC wafer as far as a focal distance ft of the objective lens 32, the parallel light is condensed into a point on the IC wafer 1.

Next, when the light must be condensed into two different points by adjusting the light axis adjusting portion, this can be achieved by rotating the goniometer. The distance between the two different points can be determined by the rotating angle of the goniometer. That is, when it is assumed that the distance between two points is A, the focal distance of the objective lens 32 is ft, the rotating angle of the light axis adjusting portion 5d is θ a, the light condensation distance A is obtained by the following equation; A=ft×tan θ a. The change of the light axis at an angle of θ a is shown in FIG. 4 by a one-dot chain line.

As shown above, even when there are two light receiving portions on the IC wafer, it is possible to enter light exclusively on light receiving portions by condensing light accurately into two points, and using two excitation optical system 6b and 6b' and the objective lens commonly.

Next, an example is described in which the light axis adjusting portion is constituted by a telecentric optical system with reference to FIG. 5. In the example shown in FIG. 5, the light axis adjusting portion 5d comprises a condenser lens 5e, an XY stage 5f, which can be moved finely in two directions crossing each other at an right angle, and a collimation lens 5g for re-converting the condensed light into parallel light.

The excitation optical system 6b', the half mirrors 42a, and the objective lens 32 are the same as those shown in FIG. 4, so that explanations of these components are omitted.

The excitation optical system 6b, the detachable portion 42a, and the condenser lens 5e are finely aligned by precisely sliding the XY stage 5f having sliding surfaces 5f, shown in FIG. 5. The condenser lens 32 and the collimation lens 5g are arranged such that the light path length between the light entering surface of the condenser lens 32 and the collimation lens 5g is identical with the rear side focal length fb of the collimation lens 5g. In addition, the collimation lens 5e may be distanced from the excitation optical system as far as the focal length. Thus, the light beam spread at the point C becomes collimated into a parallel beam. The thus collimated parallel beam is turned by the half-mirror 32, enters into the objective lens, and is condensed on a point on the IC wafer 1 by the objective lens 32.

The XY stage 5f is arranged so as to condense the parallel beam generated by the excitation optical system 6b on a position C' initially. In this arrangement, since the light axis of the parallel beam output from the collimation lens 5g crosses the light axis of light originated from the excitation optical system 6b' at an right angle, these two parallel beams are condensed on a position on the IC wafer 1. When the polarization optical system 6b is displaced from this initial arrangement to a position at a distance of F by sliding the XY stage 5f, parallel beams condensed on one position on the IC wafer 1 are separated into two positions by a distance of F'. Since the distances of F and F' are identical, two condensed light beams can be separated by a distance in proportion to the sliding distance of the XY stage 5f. In addition, since the XY stage 5f can be displaced into two directions, the light beam can be positioned at any position around the position of the initial position of light originating from the excitation optical system 6b'.

As shown above, provision of the telecentric optical system allows two light beams condensed exclusively only in two light receiving portions located at two different positions by finely displacing the excitation optical system 6b.

It is noted that, since these two excitation optical systems 6b and 6b' uses independent light sources, respectively, any one of the light beams emitted from those light sources can be made incident on the IC wafer by changing the timing of emission, which allows a particular measurement in the case of changing the entering timing to a plurality of respective light receiving portions.

Next, a measurement operation of the electric signal in the wiring on the IC wafer 1 by the EOS optical system 6a is described.

A laser beam is supplied to the EOS optical system 6a from the outside using an optical fiber 11. The laser beam is converted into a parallel beam by a fiber collimator 69.

Next, this parallel light is turned by 90 degrees by the dichromic mirror 41a in the probe body 41 and is condensed by the objective lens 31. The thus condensed laser light arrives at the surface of the electro-optic element facing the wiring on the IC wafer 1, after propagating through the electro-optic element.

At this time, the refractive index of the electro-optic element 2 changes by the Pockels effect due to the electric field applied to the electro-optic element 2 caused by the applied voltage to the wiring. Thereby, the polarization state of the laser light changes after entering and during propagating through the electro-optic element. After being subjected to the change of the polarization state, the laser light is reflected by the mirror formed on the electro-optic element placed on the wiring of the IC wafer, and enters into the EOS optical system after propagating in the opposite direction of the same light path that starts from entering into the electro-optic element. This laser light is isolated by the light isolator 60, is made incident on the photodiode, and is converted into an electric signal.

The fluctuation of the voltage applied to the wiring of the IC wafer causes a change of the polarization state of the electro-optic element, which produces an output difference between the outputs from the first and second photodiodes 67 and 68. The electric signal transmitting in the wiring of the IC wafer 1 can be measured by detecting this output difference.

As shown above, the preset apparatus is designed such that the electric signal propagating through the wiring of the IC wafer 1 can be detected, while irradiating the excitation light from the rear surface of the IC wafer 1, the measurement can be carried out for the rear surface irradiation-type IC. In addition, provision of two excitation optical systems 6b and 6b' which commonly use an objective lens makes it possible to project two condensed light beams exclusively on two different light receiving portions.

Projection of the excitation light can be made not only by the excitation optical system 6b, but also by the EOS optical system 6a. When the EOS optical system is used as the light source, the EOS system may be used for emitting light to project the condensed light on the rear surface, as when measuring the electric signal. In this case, the outputs of two photodiodes 67 and 68 cannot be used for further processing.

Addition of necessary numbers of excitation optical systems 6b and half mirrors allows projecting condensed light beams on more than three light receiving portions. Furthermore, installation of the EOS optical system instead of the excitation optical system makes it possible to carry out measurement even for an IC wafer, in which the light receiving portion is present on the same surface for measurement.

When the IC wafer comprises a substrate made of an electro-optic crystal such as GaAsInP, fitting of an EOS optical system 6a to the probe body 42 installed on the rear surface of the IC wafer makes it possible to measure by condensing the laser light directly projecting on the rear surface of the IC wafer1. By adopting such a method, it is possible to carry out the measurement of the electric signal not only for the wiring on one side but also for both surfaces, if wiring exists on both surfaces.

As explained above, the EOS sampling probe of the present invention provides the excitation optical system for projecting an excitation light beam on the rear surface of the IC wafer, the present invention has the effect that the EOS sampling probe may carry out an signal measurement for the particular IC wafer which is excited from the rear surface.

According to this invention, since the present EOS optical system provides a detachable portion, to which the EOS optical system and the excitation optical system are commonly attachable, and since the excitation optical system can be attached at the front surface of the IC wafer and the EOS optical system can be attached at the rear surface, the effect is obtained that measurement can be made by selecting either the front or rear surfaces in accordance with the specification of the IC wafer. Since it is also possible to substitute one element for both objective lens and half mirror of the excitation optical system, the EOS probe of the present invention can be constituted by a simple structure using a reduced number of elements.

The present invention exhibits the effect that the measurement of the electric signals can be made for both surfaces of the IC wafer simultaneously when the IC wafer has wiring on both surfaces, by replacing the excitation optical system with the EOS optical system.

Furthermore, the present invention exhibits the further effect that it is possible to project condensed light beams onto a plurality of light receiving portion, because a light axis adjusting means is provided between the excitation optical system and the probe body.

What is claimed is:

1. An electro-optical sampling probe for testing IC wafers comprising:

an electro-optic element to contact the wiring on one surface of an IC wafer and having optical properties which change due to an electric field applied through the wiring to act on said electro-optic element;

an electro-optic sampling optical system module, which comprises therein polarization beam splitters, half wave plates, and photodiodes, for converting a laser beam into electric signals, separated after a laser beam externally generated has been propagated through said electro-optic element and reflected at a surface of said electro-optic element facing said IC wafer wiring;

a first probe body for covering a light path output from said electro-optic sampling optical system module;

a first detachable portion for attaching and detaching said electro-optic sampling optical system module to said first probe body;

excitation optical system modules for irradiating a light to another surface of the IC wafer in a condensed state for excitation of the IC wafer;

a second probe body for covering a light path output from said excitation optical system modules; and second detachable portions, having a form identical with said first detachable portion, for attaching and detaching said excitation optical system modules to said second probe body;

wherein the excitation light beam from each of said excitation optical system modules, is condensed by the objective lens for condensing a respective one of said excitation light beams on the IC wafer, and at least one of said excitation optical system modules has a light axis which:differs from that of the other of said excitation optical system modules, so that the excitation light beams are irradiated on at least two different light receiving portions disposed on the IC wafer.

2. An electro-optic sampling probe according to claim 1 which further comprises a light axis adjusting portion at the output side of each of said excitation optical system modules, for adjusting the light axis of light beams emitted by said excitation optical system module.

3. An electro-optic sampling probe according to claim 2 wherein said light axis adjusting portion comprises a gonio-stage which moves on a circumference around the input portion into said objective lens.

4. An electro-optic sampling probe according to claim 2 wherein said light axis adjusting portion comprises:

an XY stage movable in two directions crossing at a right angle;

a first lens for condensing a light beam output from each of said excitation optical system modules; and a second lens for collimating the light beam condensed by said first lens into a parallel beam.

5. An electro-optic sampling probe according to claim 1 wherein each of said excitation optical system modules includes a half-wave plate.

6. An electro-optic sampling probe according to claim 1, which uses a light beam emitted from said electro-optic sampling optical system module as the light excitation light source.

7. A method of measurement using the electro-optic sampling probe according to claim 1, wherein the method comprises the steps of:

irradiating excitation light beams originating from the excitation optical system modules on the light receiving portions mounted on one surface of an IC wafer; and carrying out a measurement of electric signals using the electro-optic sampling system module by irradiating the light beams originated from the excitation optical system modules on another surface of the IC chip by changing irradiation timing.

* * * * *